United States Patent [19]

Ronchetti et al.

[11] Patent Number: 5,072,302
[45] Date of Patent: Dec. 10, 1991

[54] SYSTEM FOR REDUCING THE INFORMATION TRANSMITTED IN THE VARIABLE LENGTH ENCODING OF NUMERICAL DATA BLOCKS WITH ENCODING OF VALUES AND STRING LENGTHS

[75] Inventors: Luigi Ronchetti, Como; Mario Stroppiana, Turin, both of Italy

[73] Assignee: Telletra Telefonia Electronica, Milan, Italy

[21] Appl. No.: 533,522

[22] Filed: Jun. 5, 1990

[30] Foreign Application Priority Data

Jun. 7, 1989 [IT] Italy .............................. 20809 A/89

[51] Int. Cl.$^5$ ........................................... H04N 1/419
[52] U.S. Cl. ............................................. 358/261.1
[58] Field of Search ..................... 358/261.1, 433, 426

[56] References Cited

U.S. PATENT DOCUMENTS

| | | | |
|---|---|---|---|
| 3,502,806 | 3/1970 | Townsend | 358/261.1 |
| 3,560,639 | 2/1971 | Centanni | 358/261.1 |
| 4,096,527 | 6/1978 | Funita | 358/261.1 |
| 4,135,214 | 1/1979 | Weber | 358/261.1 |

Primary Examiner—Stephen Brinich
Attorney, Agent, or Firm—Ostrolenk, Faber, Gerb & Soffen

[57] ABSTRACT

A method for reducing the information transmitted in the variable length encoding of numerical data blocks with encoding of single values and string lengths of a consecutive value ("run lengths"). Advantageously, the system eliminates that transmission of the last element in a string of recurrent values preceded by a "run length" and followed by another "run length" or by a data block end. When the string of recurrent values has a length of only one element, the single element is not transmitted.

2 Claims, 1 Drawing Sheet

P5,P4,M3,P2,R3,P4,R3,P1,R3,M1,R4,P1,R3,P3,
R2,P1,P1,P1,P1,R3,P1,M1,R2,P1,P1,DD

Total symbols to be encoded and transmitted = 26

5,4,-3,2,0,0,0,4,0,0,0,1,0,0,0,-1,0,0,0,0,1,0,0,0,3,
0,0,1,1,1,1,0,0,0,1,-1,0,0,1,1,0,0,0,0,0,0, Block end Total values to be transmitted = 46

P5,P4,M3,P2,R3,P4,R3, R3,M1,R4, R3,P3,
R2,P1,P1,P1, R3,P1,M1,R2,P1, DD

Total symbols to be encoded and transmitted = 22

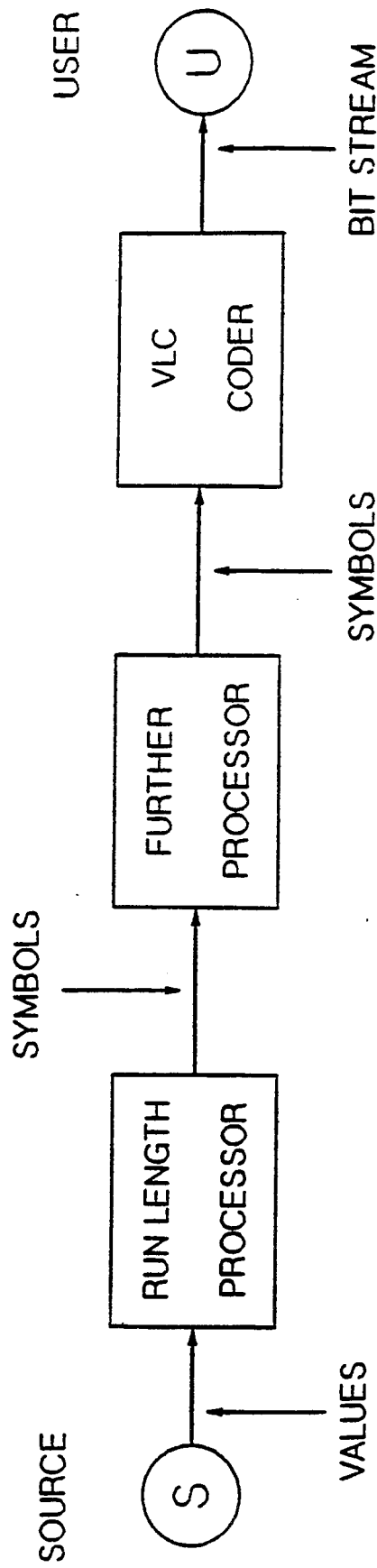

SYSTEM FOR REDUCING THE INFORMATION TRANSMITTED IN THE VARIABLE LENGTH ENCODING OF NUMERICAL DATA BLOCKS WITH ENCODING OF VALUES AND STRING LENGTHS

DESCRIPTION OF THE INVENTION

The present invention relates to a system for reducing the information transmitted in of a variable length encoding of numerical data blocks with encoding of single values and string lengths of consecutive values ("run length"). The numerical data blocks to be encoded and transmitted are of known length and can be, for instance the output of digital TV signal processors.

Without limiting in any manner and with the sole aim of example, it shall be assumed in the following that the more recurrent values held in the numerical sequences to be transmitted are in the order the zero numbers (0), the one numbers (1) (both positive and negative numbers), and then the other values appearing with decreasing frequency.

An information transmission system is known in which some values are singularly transmitted (for example the numbers different from zero) and symbols are used to represent string lengths having at least a particular recurrent value (for example the zero). This technique is referred to herein at T1.

For example, it is well-known that when a message of the following type must be transmitted:

$$5,4,-,3,2,0,0,0,4,0,0,0,1,0,0,0,-1,0,0,0,0,1,0,0,0,3,0,0-,1,1,1,1,0,0,0,1,-1,0,0,1,1,0,0,0,0,0,0, \text{Block end} \quad [M1]$$

Total values transmitted = 46,
The message to be encoded is as follows:

$$P5,P4,M3,P2,R3,P4,R3,P1,R3,M1,R4,P1,R3,P3,R2,-P1,P1,P1,P1,R3,P1,M1,R2,P1,P1,DD \quad [M2]$$

Total symbols encoded and transmitted = 26
where Rn represents n consecutive zeros and DD is the block end symbol. The system (DD) eliminates the need for the transmission of the final zeros. The symbols obtained are variable length encoded by an encoder which univocally associates any symbol to a code word. The encoder output is a digital signal which can be stored or transmitted. To further reduce the symbol numbers for each block to be transmitted, it has been proposed (for example in the patent U.S. Pat. No. 4,598,672 (T2) to distinguish the "run length" in two classes: the first class (An) represents all possible lengths of consecutive zeros (the more recurrent value) followed by another sufficiently recurrent value (for example the number one positive or negative in sign) including, therefore, in a sole symbol the information related to the number of present zeros, followed by a number one (excepting the sign); the second class (Bn) represents all possible lengths of consecutive zeros followed by other less recurrent values.

Then the message M2 encoded and transmitted is as follows:

$$V5+,V4+,V3-,V2+,B3,V4+,A3+,A3--,A4+,B3,V3+,A2+,A0+,A0+,A0+,A3+-,A0-,A2+,A0+,DD \quad [M3]$$

Total symbols encoded and transmitted = 20

Where An represents the symbol "n consecutive zeros followed by a value equal to one", Bn represents the symbol "n consecutive zeros followed by a value different from one", Vx represents the symbol "value x (with x different from one and zero)", the signs + and − indicate that the previous value was respectively positive and negative, and DD is the block end symbol.

This system includes some advantages, but it has other drawbacks, among which it is only indicated that, being compelled to differentiate the "run length" of type Bn from the ones of type An (now introduced, that hold implicitly the information of the following number) with one another, it is necessary to increase the code words of the encoding alphabet (translation of the symbol into bits). The object of the present invention (T3) is to provide a system that does not have the drawbacks of the well-known techniques and by which, in particular, it is possible to reduce the symbols to be transmitted in each block without introducing problems of any other type.

The system according to the invention is characterized in that all strings of N consecutive numbers, equal to a sufficiently recurrent value (for example the positive number one) preceded by a "run length" (for example the Rn of the message M2) and followed by another "run length" or by a block end symbol, are transmitted as they were made-up of N−1 values.

According to a feature of the invention, when N=1, no symbol is transmitted. It is necessary to underline that this does not cause a data loss, as the message user posses all information necessary for the easy reconstruction of the original transmitted sequence.

The message M2, indicated again hereunder, $$\begin{array}{c} \overset{\mathrm{I a}}{\phantom{X}} \quad \overset{\mathrm{I b}}{\phantom{X}} \\ P5,P4,M3,P2,R3,P4,R3,P1, \; R3,M1,R4,P1,R3,P3, \\ R2,P1,P1, \; P1,P1,R3,P1,M1,R2,P1, \; P1,DD \\ \overset{\mathrm{I c}}{\phantom{X}} \quad\quad\quad\quad\quad\quad\quad \overset{\mathrm{I d}}{\phantom{X}} \end{array} \quad [M2]$$

is now encoded and transmitted as follows:

$$P5,P4,M3,P2,R3,P4,R3,R3,M1,R4,R3,P3,R2,P1,P1,-P1,R3,P1,M1,R2,P1,DD \quad [M4]$$

Total symbols to be encoded and transmitted = 22.

As it can be noticed comparing M4 with M2, the convention has e.g. been adopted of transmitting no number one (positive) when it is isolated between two "run lengths" (cases a and b) or when it is the last number of a string included between two "run lengths" (case c), and also when it is the last number of a string preceded by a "run length" and followed by the block end symbol (case d). According to the well-known technique T1, the message M1 of the above mentioned example, made-up of 46 numbers, is transmitted by 26 symbols (M2) instead of 20 (M3) of the successive well-known technique T2 (U.S. Pat. No. 4,689,672), while, according to the system forming the object of the present invention (T3), 22 symbols are necessary (M4).

Generally, as it can be seen from this simple example, according to the invention (T3), more symbols are necessary for each block in comparison with the former well-known technique (T2): but the important matter is the translation of transmitted symbols into bit sequence. In fact, the former well-known technique (T2) necessitates of increasing the code words of the encoding alphabet to differentiate the "run length" of type Bn from the ones of type An (introduced for transmitting implicitly the information onto the number following the "run length") among one another, and it causes a deterioration of the translation of the transmitted symbols in bit sequence. The system according to the invention does not offer particular disadvantages for its hardware implementation, for which it is sufficient to introduce only few additional combinatory and sequential logic elements into the traditional processor, that "groups" the zeros for calculating the "run lengths".

We claim:

1. A method for reducing the information transmitted in variable length encoding of numerical data blocks with encoding of values and string lengths defined as "run lengths", said method comprising eliminating the transmission of the last recurrent value in a string of recurrent values, when said string of recurrent values are preceded by a "run length" and followed by another "run length" or by a block end symbol.

2. A method according to claim 1, in which, when the string of recurrent values comprises a string of one value, it is not transmitted.

* * * * *